(12) United States Patent
Tedrow (10) Patent No.: US 6,597,606 B2
(45) Date of Patent: Jul. 22, 2003

(54) CHARGING A CAPACITANCE OF A MEMORY CELL AND CHARGER

(75) Inventor: Kerry D. Tedrow, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/154,019

(22) Filed: May 23, 2002

(65) Prior Publication Data

US 2003/0002374 A1 Jan. 2, 2003

Related U.S. Application Data

(62) Division of application No. 09/888,252, filed on Jun. 22, 2001.

(51) Int. Cl.$^7$ .............................................. G11C 16/04
(52) U.S. Cl. ............................ 365/185.28; 365/185.18; 365/185.24
(58) Field of Search ................... 365/185.18, 185.19, 365/185.24, 185.28, 185.29

(56) References Cited

U.S. PATENT DOCUMENTS

| | | |
|---|---|---|
| 5,043,940 A | 8/1991 | Harari |
| 5,163,021 A | 11/1992 | Mehrotra et al. |
| 5,621,667 A | 4/1997 | Doller |
| 5,671,388 A | 9/1997 | Hasbun |
| 5,949,714 A | 9/1999 | Hemink et al. |
| 6,011,715 A * | 1/2000 | Pasotti et al. .......... 365/185.19 |
| 6,091,618 A | 7/2000 | Fazio et al. |
| 6,104,637 A | 8/2000 | Seo |
| 6,259,627 B1 | 7/2001 | Wong |
| 6,366,496 B1 * | 4/2002 | Torelli et al. .......... 365/185.19 |

OTHER PUBLICATIONS

Intel®, A-325 Application Note, Guide to First Generation Flash Memory Reprogramming, Mar. 1994, pp. 1-23.

* cited by examiner

*Primary Examiner*—Son Mai
(74) *Attorney, Agent, or Firm*—Blakely, Sokoloff, Taylor & Zafman LLP (57) ABSTRACT

The present invention is in the field of charging a capacitance of a memory cell. Embodiments of the present invention program a memory cell by determining programming pulses to be used to program the memory cell based on a target state and the memory cell's response to previous program pulses.

15 Claims, 6 Drawing Sheets

FIGURE 1A

Main. [100]

determining a programming pulse from a measurement of a memory cell.

FIGURE 1B

Determining a programming pulse from a measurement of a memory cell. [102]

determining a relationship of a change in threshold voltage to a change in bit line voltage.

↓ determining the programming pulse from the relationship of a change in threshold voltage to a change in bit line voltage. [130]

FIGURE 1C

Determining a relationship of a change in threshold voltage to a change in bit line voltage.

applying a default programming pulse to a bit line of a transistor of the memory cell. [105]

↓ determining a change in threshold voltage of the transistor. [110]

↓ storing the change in threshold voltage. [115]

FIGURE 1D

Determining the programming pulse from the relationship of a change in threshold voltage to a change in bit line voltage.

determining an intermediate threshold voltage wherein the intermediate threshold voltage is less than a target threshold voltage and greater than a present threshold voltage. [135]

↓ determining the programming pulse to change from the present threshold voltage to the intermediate threshold voltage. [140]

FIGURE 1E

Applying the programming pulse to the memory cell to increase the charge on the capacitance. [150]

programming substantially within a linear mode of the transistor of the memory cell. [155]

↓ applying a sufficiently low programming pulse to avoid overshooting a target state. [160]

applying the programming pulse to the memory cell to increase the charge on the capacitance.

CHARGING A CAPACITANCE OF A MEMORY CELL AND CHARGER

This is a divisional application of a parent application, Ser. No. 09/888,252, filed Jun. 22, 2001.

FIELD OF INVENTION

The present invention is in the field of charging a capacitance of a memory cell. More particularly, embodiments of the present invention can set a threshold voltage of a memory cell to represent data.

BACKGROUND

One factor of the size, speed, and power consumption of memory can be the programming algorithm. A programming algorithm is an algorithm that can store a charge on a floating gate of a transistor, changing the threshold voltage of the transistor. Multi-level-cell (MLC) programming algorithms may program the transistor from an erase state, a minimum charge range, to more than one program states. Each program state may be a range of charge on the floating gate and can be separated by an error range to allow a read circuit to distinguish program states. Further, the width of each program state can depend on the accuracy of the programming algorithm and the width of each error range can depend on the accuracy of the reading circuitry when considering the effects of noise.

Programming algorithms may apply programming pulses to a transistor in saturation mode to reduce the chance of overshooting a target state. Applying programming pulses to the transistor can increase the charge on the floating gate to a target threshold voltage, a charge level within the target state. When the programming pulses are applied so the transistor remains in saturation mode, the charge increases logarithmically to program the transistor slowly. The chance of overshooting the target state can be reduced by programming in saturation mode at the cost of applying extra pulses. However, overshooting a target state can slow down the speed of the memory even more since the overshoot can require a row of transistors to be erased and reprogrammed.

Programming algorithms program a transistor, for example, by applying one-microsecond programming pulses using a gate voltage that is increased by 250 millivolts for each pulse until the transistor verifies as having a charge within the target state. However, algorithms may be data dependent because program states that require a greater charge can also require more programming pulses. Each extra programming pulse requires more time and energy. Thus, the amount of time and energy expended to store data depends on the data to be stored.

BRIEF FIGURE DESCRIPTIONS

In the accompanying drawings like references may indicate some similarities between elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments. The variations of embodiments anticipated are too numerous to discuss individually so the detailed descriptions below are designed to make such embodiments obvious to a person of ordinary skill in the art.

In particular, the following describes method, apparatus, and machine-readable medium embodiments to charge a capacitance of a memory cell. Referring to FIGS. 1a–e, example flow charts for embodiments are shown. The embodiments depicted comprise determining a programming pulse from a measurement of a memory cell 100 and applying the programming pulse to the memory cell to increase the charge on the capacitance 150. Determining a programming pulse from a measurement of a memory cell 100 may be designed to determine a programming pulse voltage for the bit line that can charge the capacitance of the memory cell to a desired threshold voltage. Determining a programming pulse from a measurement of a memory cell 100 can comprise determining a relationship of a change in threshold voltage to a change in bit line voltage 102 and determining the programming pulse from the relationship of a change in threshold voltage to a change in bit line voltage 130.

Determining a relationship of a change in threshold voltage to a change in bit line voltage 102, in the present embodiment, may comprise applying a default programming pulse to a bit line of a transistor of the memory cell 105, determining a change in threshold voltage of the transistor 110, and storing the change in threshold voltage 115. Applying a default programming pulse to a bit line of a transistor of the memory cell 105 can allow measurement of the change in threshold voltage to the change in bit line voltage for that transistor without overshooting the target state. To avoid overshooting the target state, the variability of the program rate of the transistor should be considered. Transistor programming rates can vary up to 10 times over a memory array. Applying a default programming pulse to a bit line of a transistor of the memory cell 105 can comprise determining a number of default programming pulses to apply and increasing the bit line voltage from pulse to pulse until noise margin is exceeded.

Determining a change in threshold voltage of the transistor 110 can be used to tailor the programming steps to a particular transistor. The present embodiment programs the transistor within its linear mode so once a transistor's change in threshold voltage is known for a known change in bit line voltage, the transistor can be programmed within five or six pulses without data dependency, i.e. regardless of the target state. When more than one transistor is programmed at once each memory cell can receive an independently determined programming pulse. Determining a change in threshold voltage of the transistor 110 can comprise determining an initial, threshold voltage and determining a change in threshold voltage from the threshold voltage after applying a default programming pulse. Storing the change in threshold voltage 115 is designed to retain the measured threshold voltage to use as an initial threshold voltage for the next programming pulse.

Figure 1A:
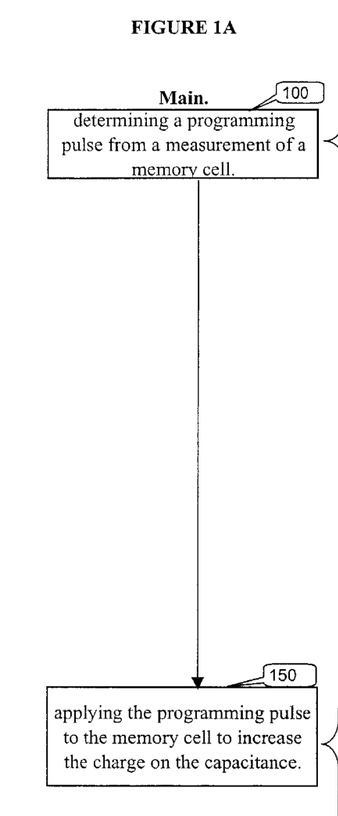
FIGS. 1a–e depict flow charts to program a memory cell.
Figure 1B:
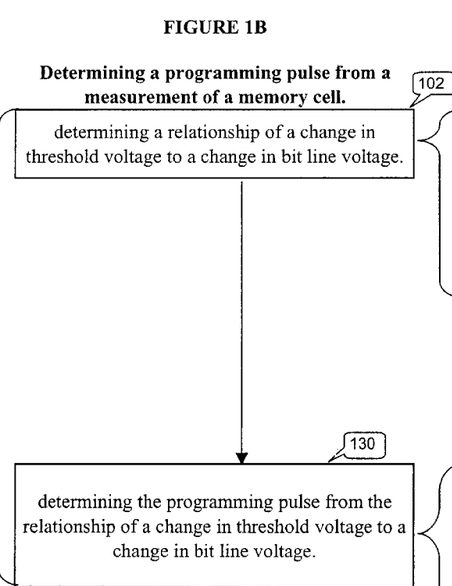
Figure 1C:
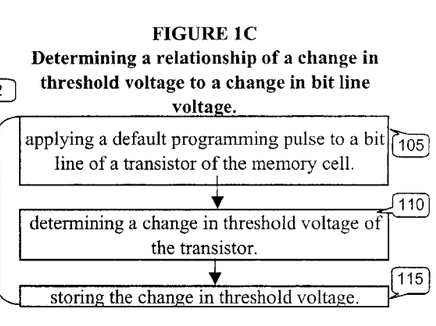
Figure 1D:
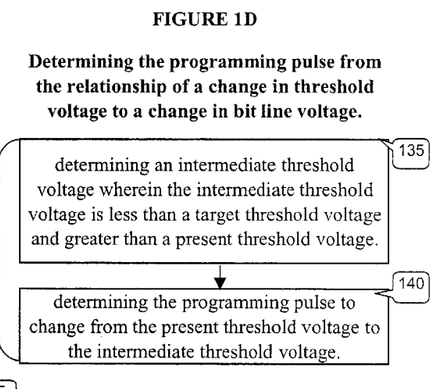
Figure 1E:
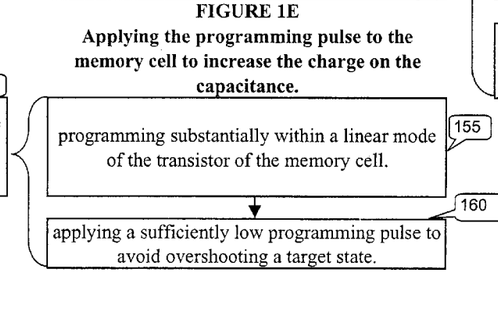

Referring now to FIGS. 1a and 1d, a detailed flow chart for determining a programming pulse from the relationship of a change in threshold voltage to a change in bit line voltage 130 is shown. Determining a programming pulse from the relationship of a change in threshold voltage to a change in bit line voltage 130, for this embodiment, may comprise determining an intermediate threshold voltage wherein the intermediate threshold voltage is less than a target threshold voltage and greater than a present threshold voltage 135 and determining the programming pulse to change from the present threshold voltage to the intermediate threshold voltage 140. Once the change in threshold voltage per change in bit line voltage is determined, a default programming pulse is no longer used but a pulse is determined to bring the threshold voltage to an intermediate threshold voltage. The intermediate threshold voltage may be chosen to avoid overshooting the target state. An intermediate threshold voltage can be the difference between the target threshold voltage and the present threshold voltage multiplied by a constant such as one half. Setting the intermediate threshold voltage this way may minimize the number of pulses necessary to reach the target state.

Referring now to FIGS. 1a–e, applying the programming pulse to the memory cell to increase the charge on the capacitance 150 comprises programming substantially within a linear mode of the transistor of the memory cell 155 and applying a sufficiently low programming pulse to avoid overshooting a target state 160. Programming substantially within a linear mode of the transistor of the memory cell 155 can reduce the number of pulses and the length of the pulses for programming a transistor. In linear mode, a transistor can have a large threshold voltage change for a short pulse of approximately 100 nanoseconds or less. Applying a sufficiently low programming pulse to avoid overshooting a target state 160 may be accomplished in the present embodiment by applying the programming pulse obtained by determining an intermediate threshold voltage wherein the intermediate threshold voltage is less than a target threshold voltage and greater than a present threshold voltage 135 and determining the programming pulse to change from the present threshold voltage to the intermediate threshold voltage 140.

Referring now to FIGS. 2a–e, other embodiments to charge a capacitance of a memory cell are shown. These embodiments can be designed to adapt to a specific memory cell and the conditions under which it operates so it is well suited for use in flash. These embodiments can comprise determining a programming pulse from a measurement of a memory cell 200, applying the programming pulse to the memory cell to increase the charge on the capacitance 260, and verifying a program state of the memory cell 280. Determining a programming pulse from a measurement of a memory cell 200 can determine a sequence of programming pulses to apply to the bit line such that the capacitance of the transistor of the memory cell is charged until the transistor is in a target state. In the present embodiment, determining a programming pulse from a measurement of a memory cell 200 may comprise determining a relationship of a change in threshold voltage to a change in bit line voltage 202 and determining the programming pulse from the relationship of a change in threshold voltage to a change in bit line voltage 220.

Determining a relationship of a change in threshold voltage to a change in bit line voltage 202 may comprise applying a default programming pulse to a bit line of a transistor of the memory cell 205, determining a change in threshold voltage of the transistor 210, and storing the change in threshold voltage 215. Applying a default programming pulse to a bit line of a transistor of the memory cell 205 may be accomplished by storing a default value for a programming pulse in a default programming pulse memory. In some instances, a slow programming transistor may not have a discernable threshold voltage change for a default bit line voltage. For example, the change in threshold voltage of the transistor may be sufficiently small relative to noise that the measured change in threshold voltage is predominantly noise. Therefore, many embodiments of the present invention incorporate a minimum threshold voltage change below which the change in threshold voltage can be ignored. In these embodiments, more than one default programming pulse may be implemented. When the change in threshold voltage is below the minimum threshold voltage change, an additional default programming pulse can be applied. In some embodiments, additional default pulses may comprise an increased bit line voltage for each pulse to reduce the number of pulses required to achieve the desired minimum threshold voltage change.

Determining a change in threshold voltage of the transistor 210 can measure the charge resulting from electron tunneling, hot electron injection or hot hole injection. In some transistors, hot electron injection and hot hole injection may place a negative and positive charge on a floating gate of the transistor, respectively. The charge on the gate creates a channel between the source and the drain of the transistor to support a current. Flash memory typically comprises a method of comparing the drain-to-source current to a reference current or a voltage of the transistor to a reference voltage to determine the transistor state. In some embodiments of the present invention, the charge on a capacitance of the transistor can be determined by measuring a current or a voltage, comparing the current or voltage to more than one references, and interpolating between the more than one references. Storing the change in threshold voltage 215, in the present embodiment, can be used for determining the programming pulse from the relationship of a change in threshold voltage to a change in bit line voltage 220. The stored threshold voltage can be used as a present threshold voltage and/or a prior threshold voltage.

Referring to FIGS. 2a–d, an embodiment for determining the programming pulse from the relationship of a change in threshold voltage to a change in bit line voltage 220 is shown. Determining the programming pulse from the relationship of a change in threshold voltage to a change in bit line voltage 220 may comprise determining an intermediate threshold voltage by multiplying a difference between a present threshold voltage and a target threshold voltage by a constant 225 and determining a change in bit line voltage as a function of target threshold voltage, present threshold voltage, prior threshold voltage, and prior bit line voltage 235. Determining a change in bit line voltage as a function of target threshold voltage, present threshold voltage, prior threshold voltage, and prior bit line voltage 235 may comprise determining a rate correction, the desired change in programming rate for the next pulse relative to the previous pulse, as a function of the intermediate threshold voltage, present threshold voltage and prior threshold voltage, and determining the change in bit line voltage from the rate correction. For example, a rate correction factor of one half indicates that the next programming pulse should program at one half the rate as the previous pulse. Determining an intermediate threshold voltage by multiplying a difference between a present threshold voltage and a target threshold voltage by a constant 225, in the present embodiment, can comprise retrieving the present threshold voltage from memory, subtracting it from the target threshold voltage and multiplying the difference by one third. The difference may instead be divided by three to avoid overshooting the target threshold state.

Determining a rate correction as a function of the target threshold voltage may comprise, for example, taking the difference between the intermediate threshold voltage and the present threshold voltage and dividing by the difference between the present threshold voltage and a prior threshold voltage. When one default programming pulse is applied, the difference between the present threshold voltage and the prior threshold voltage can be the change in threshold voltage.

Since each step in this embodiment can be the difference between the target threshold voltage and the present threshold voltage divided by three, rate correction shows a reduced change in threshold voltage from each pulse to the subsequent pulse except from the default pulse to next pulse where the change in threshold voltage may increase. This deceleration can reduce the chance of overshooting the target state. Methods that repeat the same programming pulse can accelerate the change in threshold voltage until the target threshold voltage is reached, increasing the chance of overshooting the target threshold voltage.

Determining the rate correction as a function of a change in bit line voltage can comprise determining the rate correction as a function of the bit line voltage sensitivity of the transistor. For example, a bit line voltage sensitivity for a transistor used to store data can be two times for every 200 millivolts, i.e. the programming rate increases two times for every 200 millivolts increase in bit line voltage. Thus, the rate correction for a transistor as a function of the change in bit line voltage can be two raised to the power of the ratio of the change in bit line voltage to 200 millivolts. The programming rate can vary with the applied bit line voltage during programming and from one transistor to the next. Equating the rate correction required to achieve the intermediate threshold voltage and the rate correction as a function of the change in bit line voltage can provide a relationship between a change in threshold voltage and a change in bit line voltage. Thus, a programming pulse to change from a present threshold voltage to an intermediate threshold voltage can be calculated.

Figures 2A, 2B, 2E:
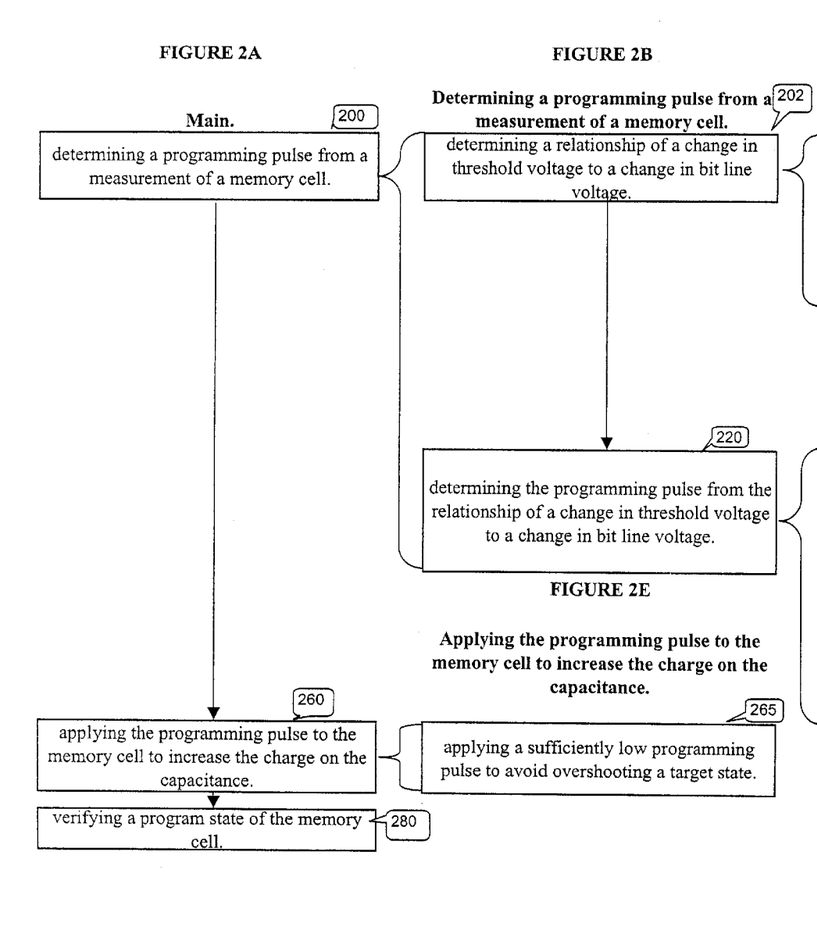
FIGS. 2a–e depict other flow charts to program a memory cell.
Figure 2C:
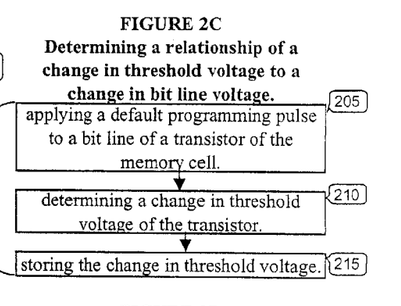
Figure 2D:
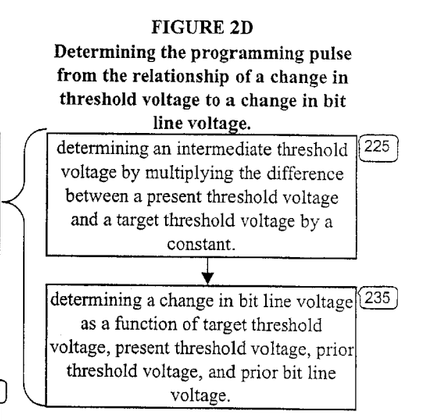

Referring to FIGS. 2a and 2e, an embodiment for applying the programming pulse to the memory cell to increase the charge on the capacitance 260 and verifying a program state of the memory cell 280 is shown. In this embodiment, the address of a transistor from a memory array may be latched and the programming pulse is applied to the transistor's bit line. Applying the programming pulse to the transistor 260 may comprise applying a sufficiently low programming pulse to avoid overshooting a target state 265.

Applying a sufficiently low programming pulse to avoid overshooting a target state 265 may be designed to apply a programming pulse with a voltage low enough to fall within the target state from any threshold voltage below the voltage range of the target state. For instance, when the program state has a range of one half volt and the threshold voltage is just less than the program state, the increase in threshold voltage can be less than one half volt. Further, when the target threshold voltage is in the middle of the voltage range for the target state, the increase in threshold voltage can be less than 250 millivolts. After the programming pulse is applied, the transistor state may be checked by verifying a program state of the memory cell 280.

Verifying a program state of the memory cell 280 can determine whether the target state is reached and, in some embodiments, determine the present threshold voltage. Determining the present threshold voltage can comprise measuring the present threshold voltage. In many embodiments, a maximum number of programming pulses can be chosen and when the transistor fails to verify after that maximum number of programming pulses, such as 25, an error may be returned for that transistor. Some embodiments comprise verifying a program state of the memory cell 280 only as a fail-safe mechanism but several embodiments presume that the target state has been reached after applying a calculated number of pulses.

Some alternative embodiments may comprise a programming pulse having more than one pulse. In some of these embodiments, the pulses of a programming pulse can comprise pulses of different voltages. For example, the programming pulse can comprise three pulses with voltages of decreasing magnitude and the threshold voltage is measured after the third pulse.

Figure 3:
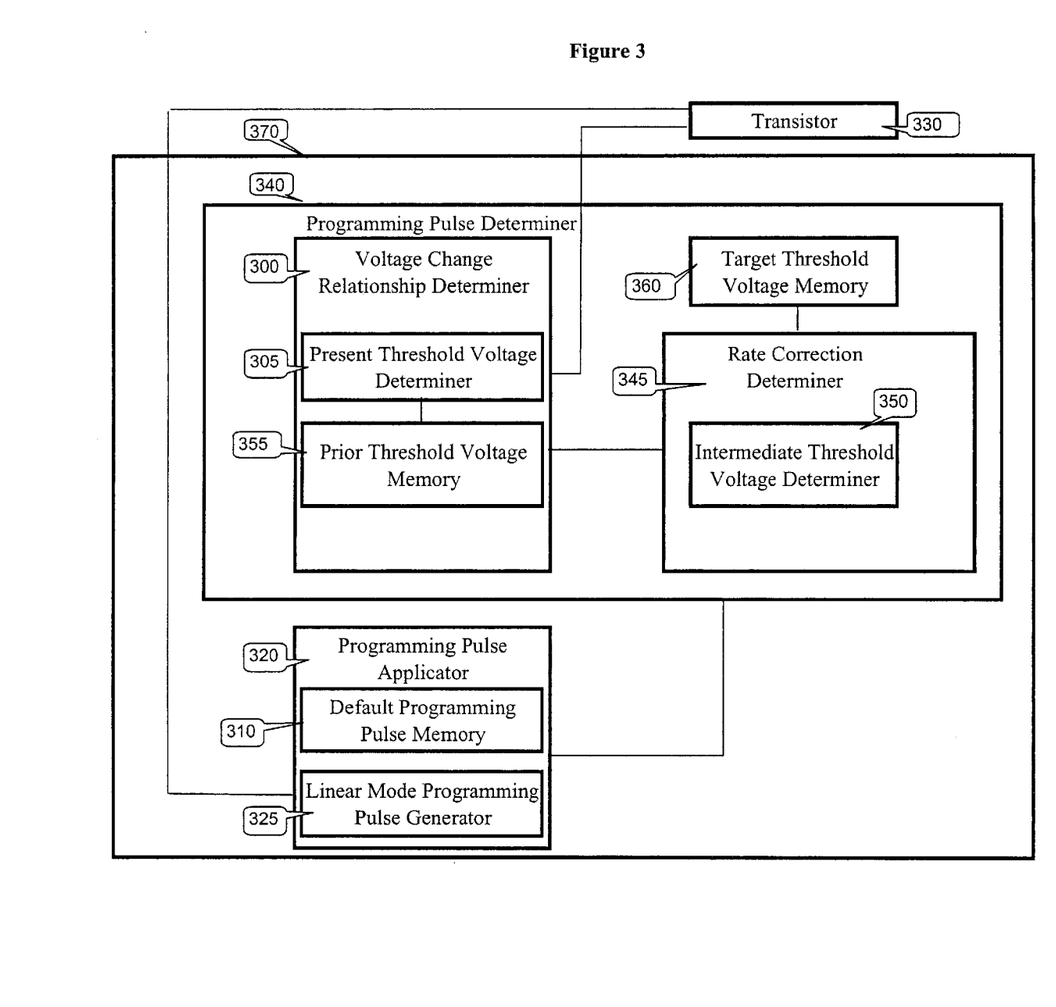
FIG. 3 depicts an apparatus to program a transistor.

Referring to FIG. 3, an embodiment 370 to charge a floating gate of a transistor 330 is shown. In this embodiment, programming pulse determiner 340 may comprise a voltage change relationship determiner 300 coupled to a transistor 330. Further, the transistor 330 can be coupled to a programming pulse applicator 320. The voltage change relationship determiner 300 may comprise a present threshold voltage determiner 305. The voltage change relationship determiner 300 may determine a relationship between a change in threshold voltage of the transistor 330 and a change in bit line voltage, corresponding to the programming pulse. Further, the voltage change relationship determiner 300 of the present embodiment may comprise a prior threshold voltage memory 355. The prior threshold voltage memory 355 can store a threshold voltage of the transistor 330 prior to applying a programming pulse to facilitate the rate correction determiner 345.

Upon determining the relationship between the change of threshold voltage and the change of bit line voltage, the programming pulse determiner 340 can determine a change in bit line voltage to attain a specific threshold voltage. The programming pulse determiner 340 of the present embodiment comprises a target threshold voltage memory 360. The target threshold voltage memory 360 can contain predetermined threshold values for each of the possible cell states.

The programming pulse determiner 340 can also comprise an intermediate threshold voltage determiner 350. The intermediate threshold voltage determiner 350 may determine a voltage less than the target threshold voltage but greater than the present threshold voltage. In this manner, the target threshold voltage can be approached by applying a programming pulse calculated to reach the intermediate threshold voltage. The intermediate threshold voltage can be designed to avoid overshooting the target threshold voltage. In the present embodiment, the intermediate threshold voltage may be determined by multiplying the difference between the target threshold voltage and the present threshold voltage by two thirds.

The rate correction determiner 345 can determine a rate correction as a function of target voltage and a rate correction as a function of change in bit line voltage. Upon determining each rate correction function, the programming pulse determiner 340 can determine a programming pulse to apply to the bit line of the transistor 330 via the programming pulse applicator 320. For the first programming pulse, the programming pulse determiner 340 may select a default programming pulse represented in the default programming pulse memory 310. When the programming pulse results in a change in threshold voltage below a minimum change in threshold voltage, the programming pulse determiner 340, in this embodiment, can be designed to select a second default programming pulse represented in the default programming pulse memory 310 with a greater voltage. The increased voltage may increase the change in threshold voltage of the transistor 330 to be discernable from noise. When the change in threshold voltage after a default programming pulse 340 is discernable from noise, the programming pulse determiner can calculate a programming pulse from the rate correction as a function of target threshold voltage and the rate correction as a function of change in bit line voltage.

The programming pulse determiner 340 may calculate a rate correction as the difference between the intermediate voltage and the present threshold voltage divided by the difference between the present threshold voltage and a prior threshold voltage. The prior threshold voltage can be stored in the prior threshold voltage memory 355. After applying a default programming pulse, in some of these embodiments, the difference between the prior bit line voltage and the next bit line voltage may be calculated from the rate correction functions. For example, for a linear programming rate of two:

$$\text{change in bit line voltage} = (100 \text{ millivolts}) * \text{Log}_2 1/2 \left( \frac{\text{intermediate threshold voltage} - \text{present threshold voltage}}{\text{present threshold voltage} - \text{prior threshold voltage}} \right) \quad (1)$$

Referring still to FIG. 3, the programming pulse determiner 340 can be coupled to the programming pulse applicator to communicate the determined programming pulse. The programming pulse applicator 320, in the present embodiment, may comprise a linear mode programming pulse generator 325. The linear mode programming pulse generator 325 can be coupled to the transistor 330 to apply a programming pulse to the bit line of the transistor 330. The linear mode programming pulse generator 325 can also be designed to maintain the transistor 330 substantially in linear mode. Many of these embodiments comprise a linear mode programming pulse generator 325 designed to output a programming pulse of a specific pulse length dependent upon the gate voltage applied to the gate of the transistor 330. For example, the present embodiment typically applies a pulse length of 100-nanoseconds for a gate voltage of approximately 12 volts.

The programming pulse applicator 320 may also comprise a default programming pulse memory 310 to store data representing a default programming pulse designed to change the threshold voltage of the transistor 330. This change of the threshold voltage can facilitate the determination of a relationship between the change in threshold voltage to a change in bit line voltage. In the present embodiment, the default programming pulse memory 310 may comprise representations for more than one default programming pulse of more than one voltage. In some embodiments the length of the default programming pulse can be increased. By changing the default programming pulse, a minimum change in threshold voltage of the transistor can be obtained when a first programming pulse does not change the threshold voltage sufficiently. For instance, slow programming transistors or aging transistors may require the additional default programming pulse to change threshold voltage sufficiently to be measured. Of course, the use of additional default programming pulses can also be used when the method of measuring the threshold voltage is not sufficiently accurate to distinguish a change in threshold voltage from noise.

Alternate embodiments may comprise a programming pulse applicator that can adjust the pulse length, while maintaining the transistor 330 in linear mode. In some of these embodiments, the pulse length can be adjusted when a default programming pulse does not create a change in threshold voltage above a minimum threshold voltage change since a minimum threshold voltage change may be necessary to overcome the effects of noise and other such factors. Some of these embodiments can modify the pulse length when the threshold voltage does not reach a selected intermediate threshold voltage after a programming pulse.

Figure 4:
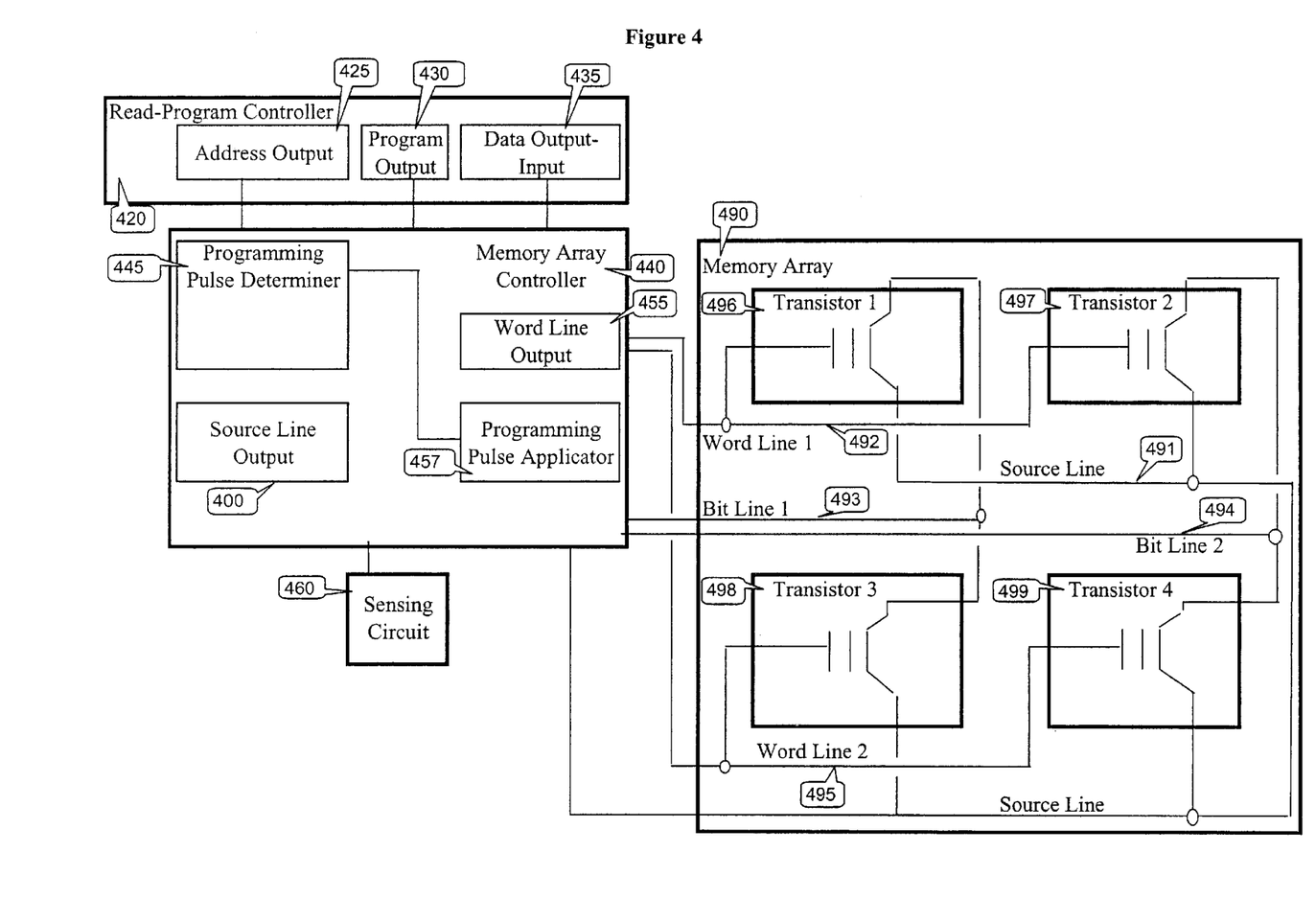
FIG. 4 depicts a memory device to store and sense data.

Referring now to FIG. 4, there is shown an alternative apparatus embodiment comprising a read-program controller 420, a memory array controller 440, a sensing circuit 460, and a memory array 490. The read-program controller 420 may receive instructions to read, program, or erase a data block and cause the instruction to be performed. For example, the read-program controller 420 may receive an instruction to program data at an address corresponding to transistor one 496 in the memory array 490. The read-program controller 420 comprises an address output 425 coupled to the memory array controller 440 to communicate the location of a memory cell to the memory array controller 440. The read-program controller 420 can comprise a program output 430 coupled to the memory array controller 440 such that the memory array controller 440 can apply the correct voltage to the word line one 492 coupled to transistor one 496 at the gate and bit line one 493 coupled to transistor one 496 at the drain. Further, the read-program controller 420 can comprise a data output-input 435 coupled to the memory array controller 440 to communicate data to the memory array controller 440 to be stored in transistor one 496. When the read-program controller 420 is instructed to read a memory cell, such as transistor one 496, the data output-input 435 can receive data from the memory cell via the memory array controller 440.

Referring still to FIG. 4, the memory array controller 440 may comprise a source line output 400. The source line output 400 may be designed to supply voltages and power to read, program, and erase data in a memory cell comprising a single transistor, transistor one 496, transistor two 497, transistor three 498, or transistor four 499. The source line output 400 can control source line voltage of memory array 490, controlling the voltage applied to the source/drain of transistor one 496, transistor two 497, transistor three 498, or transistor four 499. The memory array controller 440 may also comprise a programming pulse determiner 445 with a voltage change relationship determiner, a word line output 455, and a programming pulse applicator 457. The memory array controller 440 can be designed to latch an address of a memory cell and read, program, or erase the contents of memory cell, such as transistor one 496. For example, the read-program controller 420 may receive an instruction to program data at an address corresponding to transistor one 496 of the memory array 490. The memory array controller 440 can latch the address of transistor one 496 by applying the ten volts to word line one 492, for example, and seven volts to the bit line one 493. The source line output 400 can receive an instruction to apply zero volts to the source line 491. The address of transistor two 497, transistor three 498, and transistor four 499 may not be latched when programming transistor one 496 so zero volts may be applied to word line two 495 and seven volts may not be applied to bit line two 494. Once the address of transistor one 496 is latched, a programming pulse can be applied by the programming pulse applicator 457.

The voltage change relationship determiner may determine a relationship between a change in threshold voltage of a memory cell, e.g. transistor one 496 and the change in bit line voltage, corresponding to the programming pulse. The present embodiment can be designed to apply a default programming pulse to change the threshold voltage of transistor one 496. A relationship between the change in threshold voltage and the programming pulse can then be determined. Upon determining the relationship between the change of threshold voltage and programming pulse, the programming pulse determiner 445 can determine a programming pulse to attain a specific threshold voltage. The programming pulse determiner 445 may determine the range of voltages within which the threshold voltage must fall and select a target threshold voltage to be used to determine the programming pulse, such as a voltage in the middle of the lower and upper voltages of the range. The programming pulse determiner 445 may also determine an intermediate threshold voltage, i.e. a voltage less than the target threshold voltage but greater that the present threshold voltage. In this manner, the target threshold voltage can be approached by applying a programming pulse calculated to change the threshold voltage of transistor one 496 to the intermediate threshold voltage.

In the present embodiment, the intermediate threshold voltage may be determined by multiplying the difference between the target threshold voltage and the present threshold voltage by a constant such as two fifths. In some of these embodiments, the constant may vary from one pulse to the next while programming a memory cell. For instance, a memory cell that requires six programming pulses before it is verified as within the target state, the intermediate voltage for the first three pulses may be the difference between target threshold voltage and the present threshold voltage divided by two. This embodiment may determine the remaining pulses with the intermediate voltage as the difference between target threshold voltage and the present threshold voltage divided by three. The reduction in intermediate threshold voltage can reduce the likelihood of overshooting the target threshold voltage even further by reducing the threshold voltage change in subsequent pulses. Some of these embodiments change the intermediate voltage multiplication constant in each successive programming pulse.

Referring again to FIG. 4, the present embodiment may comprise a sensing circuit 460. The sensing circuit 460 can determine the threshold of the memory transistor using standard sensing methods. One method couples a fixed gate voltage and bit line voltage to the transistor and compares the current to the currents of reference memory transistors with known threshold voltages. Another method varies the gate of the memory transistor to find the gate voltage at which the transistor current exceeds a predefined value. This gate voltage value is then taken as the threshold voltage of the transistor.

In further embodiments of the present invention, the memory array 490 may be broken into blocks having 512 word lines with eight transistors per word line. In several of these embodiments, each transistor may have 16 states. In other embodiments, each transistor has one bit of data. In still further embodiments, the memory array controller 440 may be designed to place one bit of data in a memory cell until the amount of data stored reaches a certain level. Then the memory array controller 440 may begin storing two bits of data in each memory cell, one or more blocks at a time. Some of these embodiments further begin to store data four bits of data per memory cell when the amount of data stored reaches a certain level.

Figure 5:
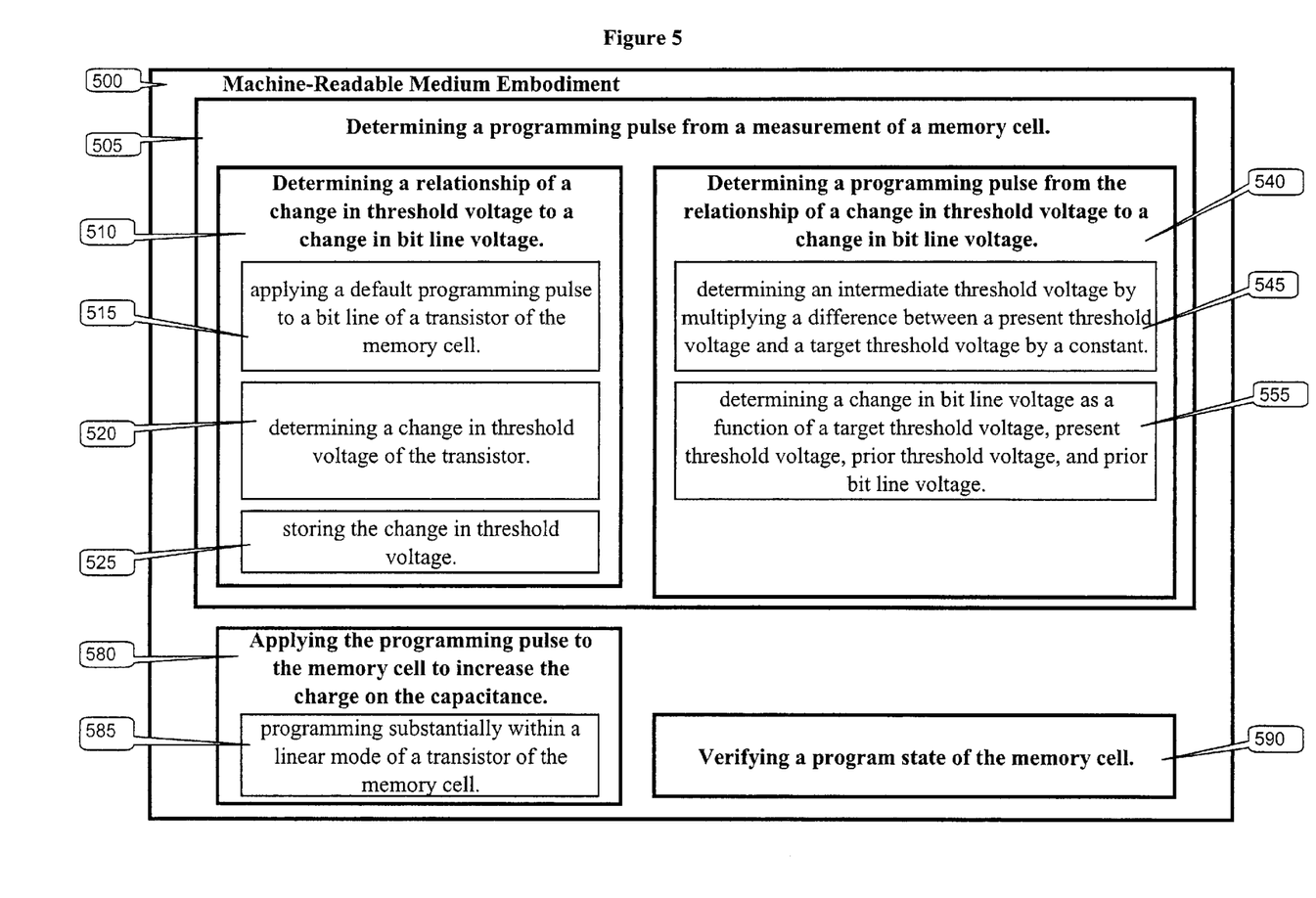
FIG. 5 depict a machine-readable medium comprising instructions to program a memory cell.

Referring now to FIG. 5, a machine-readable medium embodiment of the present invention is shown. A machine-readable medium includes any mechanism that provides (i.e. stores and or transmits) information in a form readable by a machine (e.g., a computer), that when executed by the machine, can perform the functions described herein. For example, a machine-readable medium may include read only memory (ROM); random access memory (RAM); magnetic disk storage media; optical storage media; flash memory devices; electrical, optical, acoustical or other form of propagated signals (e.g. carrier waves, infrared signals, digital signals, etc.); etc. . . . Several embodiments of the present invention can comprise more than one machine-readable medium depending on the design of the machine.

This machine-readable medium embodiment 500 may comprise instructions for determining a programming pulse from a measurement of a memory cell 505. Determining a programming pulse from a measurement of a memory cell 505 can comprise instructions to increase the charge on the capacitance of the memory cell until it reaches a desired charge such that the number of programming pulses required to charge the capacitance is limited and not dependent upon the target state. Determining a programming pulse from a measurement of a memory cell 505 can comprise instructions for determining a relationship of a change in threshold voltage to a change in bit line voltage 510.

Determining a relationship of a change in threshold voltage to a change in bit line voltage 510 can comprise applying a default programming pulse to a bit line of a transistor of the memory cell 515, determining a change in threshold voltage of the transistor 520, and storing the change in threshold voltage 525. In the present embodiment, determining a relationship of a change in threshold voltage to a change in bit line voltage 510 may have instructions designed to determine a threshold voltage change corresponding to a programming pulse. The pulse length of the programming pulse may be chosen so a mathematical relationship relating the programming pulse to the threshold voltage change along with a measurement of a change in threshold voltage to a known programming pulse may be sufficient to determine a relationship. Thus, determining a change in threshold voltage of the transistor 520, can comprise instructions for determining and storing of the initial threshold voltage, as well as, measuring a change in threshold voltage to a known programming pulse. Storing the change in threshold voltage 525 can allow the present threshold voltage to be used for further relationship determinations.

Referring still to FIG. 5, the example machine-readable medium embodiment 500 further comprises instructions for determining a programming pulse from the relationship of a change in threshold voltage to a change in bit line voltage 540. Determining a programming pulse from the relationship of a change in threshold voltage to a change in bit line voltage 540 may have instructions designed for determining an intermediate threshold voltage by multiplying a difference between a present threshold voltage and a target threshold voltage by a constant 545 and determining a change in bit line voltage as a function of target threshold voltage, present threshold voltage, prior threshold voltage, and prior bit line voltage 555. Determining a change in bit line voltage as a function of target threshold voltage, present threshold voltage, prior threshold voltage, and prior bit line voltage 555 can comprise determining a rate correction as a function of the target threshold voltage, determining the rate correction as a function of a change in bit line voltage, and determining the change in bit line voltage from the rate correction as a function of the target threshold voltage and the rate correction as a function of a change in bit line voltage.

Determining an intermediate threshold voltage by multiplying a difference between a present threshold voltage and a target threshold voltage by a constant 545 can comprise multiplying the difference between the present threshold voltage and the target threshold voltage by one half, to avoid overshooting the target state. Determining a rate correction as a function of the target threshold voltage can comprise dividing the difference between the intermediate threshold voltage and the present threshold voltage by the difference between the present threshold voltage and a prior threshold voltage. The rate correction, per instructions in this embodiment, may have a decreasing change in threshold voltage between pulses.

This change can prevent an overshoot of the target state. Determining the rate correction as a function of a change in bit line voltage can comprise determining the rate correction as a function of the linear slope of the transistor. For example, a typical linear slope for a memory cell is two times for every 200 millivolts. Thus, the rate correction for the memory cell, as a function of the change in bit line voltage, may be:

$$\text{rate correction} = 2^{\left(\frac{\text{change in bit line voltage}}{200 \text{ millivolts}}\right)} \quad (2)$$

This linear slope, or programming rate, can vary with gate voltage applied during programming and also from one transistor to the next. Instructions for equating rate corrections for determining the change in bit line voltage from the rate correction as a function of the target threshold voltage and the rate correction as a function of a change in bit line voltage can provide a relationship between a change in threshold voltage and a change in bit line voltage:

$$\frac{\text{intermediate threshold voltage} - \text{present threshold voltage}}{\text{present threshold voltage} - \text{prior threshold voltage}} = 2^{\left(\frac{\text{change in bit line voltage}}{200 \text{ millivolts}}\right)} \quad (3)$$

With equation (3), a programming pulse to change from a present threshold voltage to an intermediate threshold voltage can be calculated.

Referring still to FIG. 5, the present embodiment further may comprise instructions for applying the programming pulse to the memory cell to increase the charge on the capacitance 580 and verifying a program state of the memory cell 590. Applying the programming pulse to the memory cell to increase the charge on the capacitance 580 can have instructions designed for programming substantially within a linear mode of the transistor of the memory cell 585. Programming substantially within a linear mode of the transistor of the memory cell 585 may restrict the pulse length of the programming pulse to, for example, 100 nanoseconds or less. The pulse length can be constant for each programming pulse or the pulse length can be set in software. Verifying a program state of the memory cell 590 may comprise instructions to check the transistor state to determine whether the threshold voltage is within the target state. When the threshold voltage does not verify, the present embodiment of the invention may have instructions to apply an additional programming pulse.

In some embodiments, programming substantially within a linear mode of the transistor of the memory cell 585 can comprise programming the transistor to a threshold voltage below a target state and programming from that threshold voltage to the target state within a saturation mode of the transistor.

In some of these embodiments, verifying a program state of the memory cell may be performed after each programming pulse. In other embodiments, verifying a program state of the memory cell may be performed only after more than one programming pulse. Several embodiments do not verify the second and third programming pulse.

Figure 6:
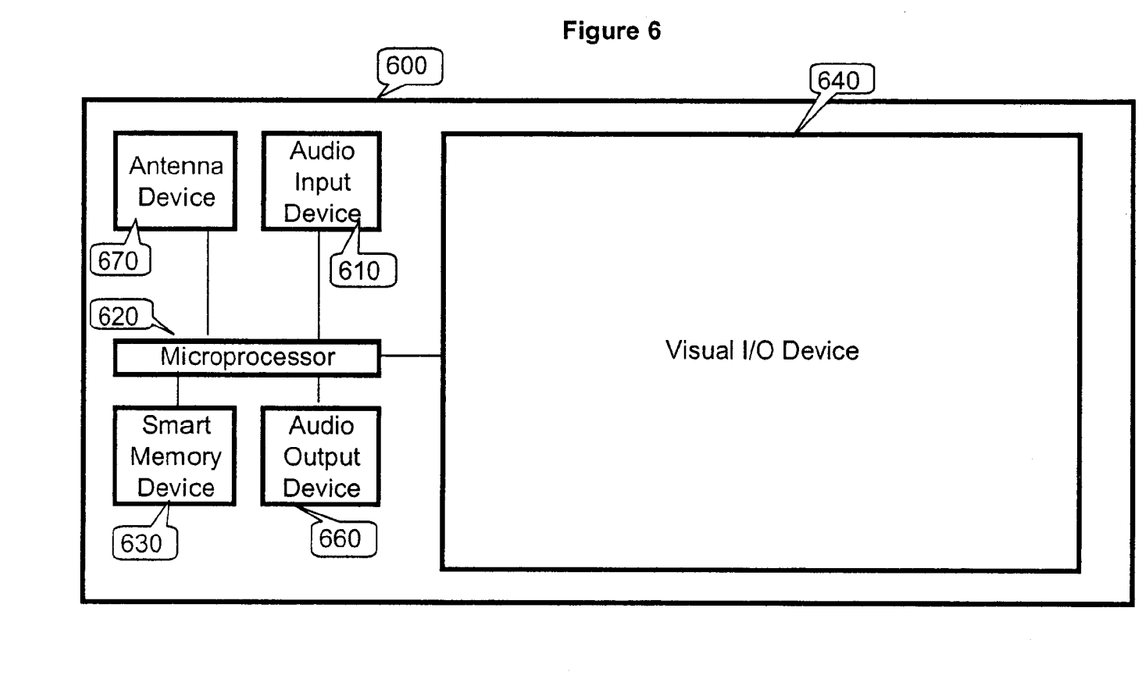
FIG. 6 depicts a wireless communications device.

Referring now to FIG. 6, there is shown an example system embodiment 600. The embodiment 600 can be designed to be a portable communication device, such as a personal digital assistant or a cell phone, and may have wireless Internet access with audio and text messaging in a digital format. The embodiment 600 may comprise input-output devices such as an audio input device 610, a visual input/output device (visual I/O device) 640, an audio output device 660, and an antenna 670, and comprise a microprocessor 620 and a smart memory device 630. The audio input device 610 may receive digital audio input and store the input in a queue in the smart memory device 630. The queue may be random access memory or flash memory designed to receive a quantity of streaming data.

The microprocessor 620 may receive an instruction via the visual I/O device 640 indicating that the input data can be stored in non-volatile memory and forward an equivalent instruction to the smart memory device 630. Smart memory device 630 may comprise memory such as flash memory. When different bits are received, the memory array controller can implement a programming algorithm to store the data in a transistor of non-volatile memory.

The programming algorithm may apply a default programming pulse to the transistor and determine the change in threshold voltage of the transistor. The default programming pulse can be designed to increase the charge on the floating gate of the transistor in the transistor's linear mode, causing the threshold voltage of a typical or nominal transistor of the memory array to increase by a minimal amount. When the change threshold voltage of the transistor is below the minimum threshold voltage change, the memory array controller may apply a second default programming pulse. The minimum threshold voltage change may be based on the accuracy of the sensing circuitry to distinguish the change in threshold voltage from noise and the width of the program states.

Once a change in threshold voltage is determined for a default programming pulse, the memory array controller may determine a programming pulse by comparing a rate correction as a function of target threshold voltage with a rate correction as a function of change in bit line voltage. In some embodiments, number of additional programming pulses may be less than eight pulses.

In many embodiments, the smart memory device 630 may have a pre-determined or default pulse width, limiting the available programming pulse voltages to voltages that maintain the transistor in linear mode. In other embodiments, the programming pulse width can be adjusted according to a pre-determined pattern such as increasing the pulse width with each successive programming pulse or group of pulses.

Basic functions for the microprocessor 620 may also be stored in protected non-volatile memory in the smart memory device 630 and can comprise instructions to display characters on the visual I/O device 640, interpret input from the input device 650, activate the audio output device 660, and receive and transmit data via the antenna device 670. Instructions for more advanced functions, such as saving audio input data, may be stored in memory locations that can be rewritten so the instructions may be updated to increase the functionality of the embodiment 600. Many embodiments include instructions to optimize power consumption by the embodiment 600 such as switching on or off devices in the embodiment 600. For instance, the visual I/O device 640 may have a backlight to allow easier viewing of information displayed and the microprocessor 620 may turn off the backlight after remaining idle for a certain period of time.

Referring still to FIG. 6, the visual I/O device 640 can receive instructions from the microprocessor 620 to display messages, like email, alpha-numeric pages, and text-based web sites. The visual I/O device 640 may also allow a user to enter instructions or data, such as a phone number or email address by touching parts of the visual I/O device 640 to enter a character or select a function.

The audio output device 660 may comprise a speaker coupled to a D/A device and may output audio data received via the antenna device 670 or the audio input device 610. Further, the antenna device 670 may comprise a receiver and transmitter for high frequency, digital data transmissions. For example, if the embodiment 600 is at a location where digital cellular services are available, the antenna device 670 may transmit and receive digital voice data, periodic digital time indications, and transmit digital voice data.

What is claimed is:

1. A system, comprising:
   a memory device coupled to a microprocessor to program an involatile memory cell to store data by application of a number of programming pulses substantially independent of the data.

2. The system of claim 1, wherein said memory device comprises:
   a memory ray; and
   a memory array controller coupled to said memory array to change a threshold voltage of the involatile memory cell in said memory array based upon a measurement of a relationship between a pulse and a change in a charge stored by the involatile memory cell.

3. The system of claim 1, further comprising an input-output device to communicate data for storage in said memory device.

4. An apparatus, comprising:
   a memory array comprising a memory cell; and
   a memory array controller coupled to the memory array to store a charge in the memory cell after application of a number of programming pulses, wherein the number is substantially independent of the charge.

5. The apparatus of claim 4, wherein the memory cell comprises a transistor having a bit line coupled to said memory array controller.

6. The apparatus of claim 4, wherein said memory array controller comprises a voltage change relationship determiner to determine a change in a threshold voltage associated with a change in a bit line voltage.

7. The apparatus of claim 6, wherein the voltage change relationship determiner comprises a present threshold voltage determiner coupled to the memory cell to determine the threshold voltage of the memory cell.

8. The apparatus of claim 4, wherein said memory array controller comprises a rate correction determiner coupled to a programming pulse applicator to determine a rate correction for the memory cell.

9. The apparatus of claim 8, wherein said memory array controller comprises a prior threshold voltage memory coupled to the rate correction determiner to store a threshold voltage before application of a programming pulse of the number of programming pulses.

10. The apparatus of claim 8, wherein said memory array controller comprises a target threshold voltage memory coupled to the rate correction determiner to store a target threshold voltage for the memory cell.

11. The apparatus of claim 4, wherein said memory array controller comprises a linear mode programming pulse generator coupled to the memory cell to apply the number of programming pulses to maintain the memory cell in a linear mode.

12. A system, comprising:
   a memory array comprising an involatile memory cell;
   a memory array controller coupled to said memory array and comprising:
      a programming pulse determiner; and
      a programming pulse applicator coupled to the programming pulse determiner to store a charge in the involatile memory cell after application of a number of programming pulses, wherein the number is substantially independent of the charge;
   a read-program controller coupled to said memory array controller to access said memory away; and
   a sensing circuit coupled to a voltage change relationship determiner to determine a threshold voltage of the involatile memory cell.

13. The system of claim 12, wherein the involatile memory cell comprises a transistor coupled to said memory array controller.

14. The system of claim 12, wherein said read-program controller comprises:
   a data output-input coupled to said memory array controller;
   a program output coupled to said memory array controller; and
   an address output coupled to said memory array controller to communicate data between said memory array and said read-program controller to program the involatile memory cell to represent a bit.

15. The system of claim 12, wherein said sensing circuit comprises:
   a transistor state determiner coupled to said memory array controller;
   an erase state reference coupled to said transistor state determiner; and
   a program state reference coupled to said transistor state determiner to compare the threshold voltage of the involatile memory cell to references for threshold voltages of said memory array.

* * * * *